US006569373B2

(12) United States Patent
Napadensky

(10) Patent No.: US 6,569,373 B2
(45) Date of Patent: May 27, 2003

(54) COMPOSITIONS AND METHODS FOR USE IN THREE DIMENSIONAL MODEL PRINTING

(75) Inventor: Eduardo Napadensky, Netanya (IL)

(73) Assignee: Object Geometries Ltd., Rehovot (IL)

( * ) Notice: Subject to any disclaimer, the term of this patent is extended or adjusted under 35 U.S.C. 154(b) by 0 days.

(21) Appl. No.: 09/803,108

(22) Filed: Mar. 12, 2001

(65) Prior Publication Data

US 2002/0008333 A1 Jan. 24, 2002

Related U.S. Application Data

(60) Provisional application No. 60/195,321, filed on Apr. 10, 2000, and provisional application No. 60/188,698, filed on Mar. 13, 2000.

(51) Int. Cl.$^7$ ............................ G03C 9/08; G03C 1/73; C08F 2/50
(52) U.S. Cl. ................. 264/401; 264/494; 430/269; 430/280.1; 430/281.1; 430/286.1; 522/81; 522/83; 522/84; 522/85
(58) Field of Search ................... 430/269, 280.1, 430/281.1, 286.1; 264/401, 308, 494; 522/81, 84, 83, 85, 170, 173, 181, 182, 167

(56) References Cited

U.S. PATENT DOCUMENTS

| | | |
|---|---|---|
| 3,803,109 A | 4/1974 | Nemoto et al. |
| 3,804,736 A | 4/1974 | Pasternack |
| 4,056,453 A | 11/1977 | Barzynski et al. |
| 4,303,924 A | 12/1981 | Young, Jr. |
| 4,942,001 A | 7/1990 | Murphy et al. |
| 5,270,368 A | 12/1993 | Lent et al. |
| 5,629,133 A | 5/1997 | Wolf et al. |
| 5,674,921 A | 10/1997 | Regula et al. |
| 5,705,316 A | 1/1998 | Steinmann et al. |
| 5,707,780 A | 1/1998 | Lawton et al. |
| 5,807,437 A | 9/1998 | Sachs et al. |
| 5,855,836 A | 1/1999 | Leyden et al. |
| 5,889,084 A | 3/1999 | Roth |
| 5,902,537 A | 5/1999 | Almquist et al. |
| 5,932,625 A | 8/1999 | Watanabe et al. |
| 6,136,497 A | 10/2000 | Melisaris et al. |
| 6,259,962 B1 | 7/2001 | Gothait |

*Primary Examiner*—Susan W. Berman
(74) *Attorney, Agent, or Firm*—Eitan, Pearl, Latzer & Cohen Zedek, LLP.

(57) ABSTRACT

Compositions for use in the manufacture of 3-D objects including compositions for use as a support and/or release material in the manufacture of said 3-D objects are provided. The compositions for use in the manufacture of 3-D objects comprise at least one reactive component, at least one photo-initiator, at least one surface-active agent and at least one stabilizer. The compositions for use as a support and/or release material comprise at least one non-reactive and low-toxicity compound, at least one surface-active agent, at least one stabilizer and optionally at least one reactive component and at least one photo-initiator. Methods for manufacturing a 3-D object using the compositions of the present invention are also provided.

51 Claims, 2 Drawing Sheets

COMPOSITIONS AND METHODS FOR USE IN THREE DIMENSIONAL MODEL PRINTING

RELATED APPLICATIONS

This application claims priority of provisional application Ser. No. 60/188,698, filed Mar. 13, 2000 and provisional application Ser. No. 60/195,321 filed Apr. 10, 2000, which is incorporated in its entirety by reference herein.

FIELD OF THE INVENTION

The present invention relates to three-dimensional (3-D) modeling in general and to methods and compositions for use in 3-D printing of complex structures in particular.

BACKGROUND OF THE INVENTION

3-D printing, which works by building parts in layers, is a process used for the building up of 3-D models. 3-D printing is relatively speedy and flexible, allowing for the production of prototype parts and tooling directly from a CAD model, for example.

Using 3-D printing enables the manufacturer to obtain a full 3-D model of any proposed product before tooling, thereby possibly substantially reducing the cost of tooling and leading to a better synchronization between design and manufacturing. A lower product cost and improved product quality can also be obtained.

Various systems have been developed for computerized 3-D printing. In U.S. Pat. No. 6,259,962 to the Assignees of the present application, and incorporated herein by reference, there is described an apparatus and a method for 3-D model printing. U.S. Pat. No. 6,259,962 describes apparatus including a printing head having a plurality of nozzles, a dispenser connected to the printing head for selectively dispensing interface material in layers, and curing means for optionally curing each of the layers deposited. The depth of each deposited layer is controllable by selectively adjusting the output from each of the plurality of nozzles.

In U.S. patent application Ser. No. 09/412,618 to the Assignees of the present invention, and incorporated herein by reference, there is described an apparatus and a method for 3-D model printing. U.S. patent application Ser. No. 09/412,618 describes a system and a method for printing complex 3-D models by using interface materials having different hardness or elasticity and mixing the interface material from each of the printing heads to control the hardness of the material forming the 3-D model. The construction layers of the model are formed from interface material having a different (harder) modulus of elasticity than the material used to form the release (and support) layers, thereby allowing for the forming of complex shapes.

Radiation curable inks are disclosed in U.S. Pat. Nos. 4,303,924, 5,889,084, and 5,270,368. U.S. Pat. No. 4,303,924 discloses radiation curable compositions for jet-drop printing containing multifunctional ethylenically unsaturated material, monofunctional ethylenically unsaturated material, a reactive synergist, a dye colorant and an oil soluble salt. U.S. Pat. No. 5,889,084 discloses a radiation curable ink composition for ink-jet printing which comprises a cationically photoreactive epoxy or vinyl ether monomer or oligomer, a cationic photo-initiator and a coloring agent. U.S. Pat. No. 5,270,368 discloses a UV curable ink composition for ink-jet printing comprising a resin formulation having at least two acrylate components, a photo-initiator and an organic carrier.

The ink compositions disclosed in these references are formulated for use in ink-jet printing. Compositions for ink-jet printing are formulated differently from compositions for building 3-D models, and thus have different properties. For example, high viscosity at room temperature is a desirable property for 3-D objects, and thus compositions for building 3-D models are designed to have a high viscosity at room temperature. In contrast, compositions for inkjet printing are designed to have low viscosity at room temperature in order to function well in the printing process. None of the above-mentioned references disclose compositions that are especially formulated for 3-D printing.

Radiation curable inks for 3-D objects are disclosed in U.S. Pat. No. 5,705,316. U.S. Pat. No. 5,705,316 discloses compounds having at least one vinyl ether group, which also contain in the molecule at least one other functional group such as an epoxy or an acrylate group; compositions comprising these compounds; and methods of producing 3-D objects using these compositions. The compounds of U.S. Pat. No. 5,705,316 are complex molecules that are not readily available and thus need to be especially synthesized, which incurs additional time and costs.

None of the above mentioned references provides simple, easily obtainable curable compositions that are suitable for use in 3-D printing. In addition, the above mentioned references do not provide compositions for use in supporting and/or releasing a 3-D model during construction. Finally, the above mentioned references do not provide methods for 3-D printing, by using interface materials having different hardness or elasticity and by mixing the interface materials to control the hardness of the material forming the 3-D model.

Thus, there is a need for simple, easily obtainable curable compositions, that are specially formulated to construct a 3-D model. There is further a need for simple, easily obtainable curable compositions, that are specially formulated to provide support to a 3-D, by forming support/and or release layers around a 3-D object during construction. Lastly, there is a need for methods of constructing a 3-D by using the above mentioned compositions.

SUMMARY OF THE INVENTION

The present invention relates to compositions for use in the manufacture of 3-D objects. The present invention further relates to compositions for use as a support and/or release material in the manufacture of said 3-D objects. The present invention further relates to method for the preparation of a 3-D object by 3-D printing, and to a 3-D object obtained by said method.

There is thus provided, in accordance with an embodiment of the present invention, a composition for use in the manufacture of 3-D objects by a method of selective dispensing. The composition comprises at least one reactive component;
at least one photo-initiator;
at least one surface-active agent; and
at least one stabilizer.

The composition has a first viscosity above 50 cps at room temperature, and a second viscosity compatible with ink-jet printers at a second temperature, wherein said second temperature is higher than room temperature.

In accordance with an embodiment of the present invention, the reactive component is an acrylic component, a molecule having one or more epoxy substituents, a molecule having one or more vinyl ether substituents, vinylcaprolactam, vinylpyrolidone, or any combination thereof.

Furthermore, in accordance with an embodiment of the present invention, the reactive component is an acrylic component. The acrylic component is an acrylic monomer, an acrylic oligomer, an acrylic crosslinker, or any combination thereof.

Furthermore, in accordance with an embodiment of the present invention, the reactive component comprises an acrylic component and in addition a molecule having one or more epoxy substitutents, a molecule having one or more vinyl ether substitutents, vinylcaprolactam, vinylpyrolidone, or any combination thereof.

Furthermore, in accordance with an embodiment of the present invention, the reactive component comprises an acrylic component and vinylcaprolactam.

Furthermore, in accordance with an embodiment of the present invention, the reactive component comprises a molecule having one or more vinyl ether substitutents.

Furthermore, in accordance with an embodiment of the present invention, the reactive component comprises a molecule having one or more epoxy substituents.

Furthermore, in accordance with an embodiment of the present invention, the reactive component comprises a molecule having one or more vinyl ether substituents, and a molecule having one or more epoxy substitutents.

Furthermore, in accordance with an embodiment of the present invention, the photo-initiator is a free radical photo-initiator, a cationic photo-initiator, or any combination thereof.

Furthermore, in accordance with an embodiment of the present invention, the composition further comprises at least one pigment and at least one dispersant. The pigment is a white pigment, an organic pigment, an inorganic pigment, a metal pigment or a combination thereof. In one embodiment, the composition further comprises a dye.

Furthermore, in accordance with an embodiment of the present invention, the first viscosity of the composition is greater than 80 cps. In one embodiment, the first viscosity is between 80 and 300 cps. In another embodiment, the first viscosity is around 300 cps.

Furthermore, in accordance with an embodiment of the present invention, the second viscosity of the composition is lower than 20 cps at a second temperature, which is greater than 60 C. Preferably, the second viscosity is between 8 and 15 cps at the second temperature, which is greater than 60 C. In one embodiment, the second viscosity is about 11 cps at a temperature around 85 C.

In addition, in accordance with another embodiment of the present invention, there is thus provided a composition for use as a support and/or release material in the manufacture of 3-D objects by a method of selective dispensing. The composition comprises at least one non-reactive and low toxicity compound
at least one surface-active agent; and
at least one stabilizer.

The composition has a first viscosity above 50 cps at room temperature, and a second viscosity compatible with ink-jet printers at a second temperature, wherein said second temperature is higher than room temperature.

In accordance with an embodiment of the present invention, the composition further comprises at least one reactive component and at least one photo-initiator. The reactive component is at least one of an acrylic component, a molecule having one or more vinyl ether substituents, or the reactive component is a water miscible component that is, after curing, capable of swelling upon exposure to water or to an alkaline or acidic water solution.

Furthermore, in accordance with an embodiment of the present invention the reactive component is an acrylic component. The acrylic component is an acrylic oligomer, an acrylic monomer, or a combination thereof.

Furthermore, in accordance with an embodiment of the present invention, the reactive component comprises at least one water miscible component that is, after curing, capable of swelling upon exposure to water or to an alkaline or acidic water solution. The water miscible component is preferably an acrylated urethane oligomer derivative of polyethylene glycol, a partially acrylated polyol oligomer, an acrylated oligomer having hydrophillic substituents, or any combination thereof. The hydrophilic substituents are preferably acidic substituents, amino substituents, hydroxy substituents, or any combination thereof.

Furthermore, in accordance with an embodiment of the present invention, the reactive component comprises a molecule having one or more vinyl ether substituents.

Furthermore, in accordance with an embodiment of the present invention, the non-reactive component is polyethylene glycol, methoxy polyethylene glycol, glycerol, ethoxylated polyol, or propylene glycol.

Furthermore, in accordance with an embodiment of the present invention, the photo-initiator is a free radical photo-initiator, a cationic photo-initiator, or a combination thereof.

Furthermore, in accordance with an embodiment of the present invention, the first viscosity of the composition is greater than 80 cps. In one embodiment, the first viscosity is between 80 and 300 cps. In another embodiment, the first viscosity is around 200 cps.

Furthermore, in accordance with an embodiment of the present invention, the second viscosity of the composition is lower than 20 cps at a second temperature, which is greater than 60 C. Preferably, the second viscosity is between 8 and 15 cps at the second temperature, which is greater than 60 C. In one embodiment, the second viscosity is about 11 cps at a temperature around 85 C.

In addition, there is thus provided, in accordance with an embodiment of the present invention, a method for preparation of a 3-D object by 3-D printing. The method comprises dispensing a first interface material from a printing head,
the first interface material comprising
at least one reactive component;
at least one photo-initiator;
at least one surface-active agent; and
at least one stabilizer;
dispensing a second interface material from said printing head, the second interface material comprising
at least one non-reactive and low toxicity compound;
at least one surface-active agent; and
at least one stabilizer;
combining the first interface material and the second interface material in pre-determined proportions to produce construction layers for forming the 3-D object.

Furthermore, in accordance with an embodiment of the present invention, the reactive component of the first interface material is an acrylic component, a molecule having one or more epoxy substituents, a molecule having one or more vinyl ether substituents, vinylpyrolidone, vinylcaprolactam, or any combination thereof.

Furthermore, in accordance with an embodiment of the present invention, the reactive component of the first interface material comprises an acrylic component. The acrylic component is an acrylic monomer, an acrylic oligomer, an acrylic crosslinker, or any combination thereof.

Furthermore, in accordance with an embodiment of the present invention, the reactive component of the first interface material comprises an acrylic component and in addition a molecule having one or more epoxy substituents, a molecule having one or more vinyl ether substituents, vinylcaprolactam, vinylpyrolidone, or any combination thereof.

Furthermore, in accordance with an embodiment of the present invention, the reactive component of the first interface material comprises an acrylic component and vinylcaprolactam.

Furthermore, in accordance with an embodiment of the present invention, the reactive component of the first interface material is a molecule having one or more vinyl ether substituents.

Furthermore, in accordance with an embodiment of the present invention, the reactive component of the first interface material is a molecule having one or more epoxy substituents.

Furthermore, in accordance with an embodiment of the present invention, the reactive component of the first interface material comprises a molecule having one or more epoxy substituents, and a molecule having one or more vinyl ether substituents.

Furthermore, in accordance with an embodiment of the present invention, the first interface material further comprises at least one pigment and at least one dispersant. The pigment is a white pigment, an organic pigment, an inorganic pigment, a metal pigment or a combination thereof. In one embodiment, the first interface material further comprises a dye.

Furthermore, in accordance with an embodiment of the present invention, the method further comprises the step of curing said first interface material.

Furthermore, in accordance with an embodiment of the present invention, the second interface material further comprises at least one reactive component and at least one photo-initiator. The reactive component is at least one of an acrylic component, a molecule having one or more vinyl ether substituents, or the reactive component is a water miscible component that is, after curing, capable of swelling upon exposure to water or to an alkaline or acidic water solution.

Furthermore, in accordance with an embodiment of the present invention the reactive component is an acrylic component. The acrylic component is an acrylic oligomer, an acrylic monomer, or a combination thereof.

Furthermore, in accordance with an embodiment of the present invention, the reactive component comprises at least one water miscible component that is, after curing, capable of swelling upon exposure to water or to an alkaline or acidic water solution. The water miscible component is preferably an acrylated urethane oligomer derivative of polyethylene glycol, a partially acrylated polyol oligomer, an acrylated oligomer having hydrophillic substituents, or any combination thereof. The hydrophilic substituents are preferably acidic substituents, amino substituents, hydroxy substituents, or any combination thereof.

Furthermore, in accordance with an embodiment of the present invention, the reactive component of the second interface material comprises a molecule having one or more vinyl ether substituents.

Furthermore, in accordance with an embodiment of the present invention, the non-reactive component is polyethylene glycol, methoxy polyethylene glycol, glycerol, ethoxylated polyol, or propylene glycol.

Furthermore, in accordance with an embodiment of the present invention, the photo-initiator of the first interface material and optionally of the second interface material is a free radical photo-initiator, a cationic photo-initiator or any combination thereof.

Furthermore, in accordance with an embodiment of the present invention, the method further comprises the step of curing the second interface material.

Furthermore, in accordance with an embodiment of the present invention, the first interface material and the second interface material have a different modulus of elasticity and a different strength. In one embodiment, the first interface material has a higher modulus of elasticity and a higher strength than the second interface material.

Furthermore, in accordance with an embodiment of the present invention, the method further comprises the step of forming a multiplicity of support layers for supporting the object. In one embodiment, the support layers are formed by combining the first interface material and the second interface material in pre-determined proportions. In one embodiment, the support layers have the same modulus of elasticity and the same strength as the construction layers. In another embodiment, the support layers have a lower modulus of elasticity and a lower strength than the construction layers.

Furthermore, in accordance with an embodiment of the present invention, the method further comprises the step of combining the first interface material and the second interface material in pre-determined proportions to form a multiplicity of release layers for releasing the support layers from the object. In one embodiment, the release layers have a lower modulus of elasticity and a lower strength than the construction layers and the support layers.

Furthermore, in accordance with an embodiment of the present invention, the first interface material and said second interface material each have a first viscosity at room temperature, and a second viscosity compatible with ink-jet printers at a second temperature, which may be the same or different, wherein said second temperature is higher than room temperature.

In addition, there is thus provided, in accordance with another embodiment of the present invention, a 3-D object comprised of a core consisting of a multiplicity of construction layers. The construction layers are prepared by combining pre-determined proportions of the first interface material and the second interface material, described hereinabove.

Furthermore, in accordance with an embodiment of the present invention, the object further comprises a multiplicity of support layers for supporting the core. In one embodiment, the support layers are prepared by combining pre-determined proportions of the first interface material and a second interface material. In one embodiment, the support layers have the same modulus of elasticity and the same strength as the construction layers. In another embodiment, the support layers have a lower modulus of elasticity and a lower strength than the construction layers.

Furthermore, in accordance with a preferred embodiment of the present invention, the object further comprises a multiplicity of release layers for releasing the support layers from the core. In one embodiment, the release layers are positioned between the support layers and the construction layers. The release layers are prepared by combining pre-determined proportions of the first interface material and a second interface material. In one embodiment, the release layers have a lower modulus of elasticity and a lower strength than the construction layers and the support layers.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention relates to compositions for use in the manufacture of 3-D objects, and to compositions for use as a support and/release material in the manufacture of 3-D objects. The present invention further relates to a method for the preparation of a 3-D object by 3-D printing, using the above-mentioned compositions, and to a 3-D object obtained by said method.

The composition for use in the manufacture of the 3-D objects comprises at least one reactive component, at least one photo-initiator, at least one surface-active agent and at least one stabilizer. The composition is formulated so as to be compatible for use with ink-jet printers and to have a viscosity at room temperature above 50 cps.

The composition for use as a support and/or second interface material in the manufacture of the 3-D objects comprises at least one non-reactive and low-toxicity component, at least one surface-active agent and at least one stabilizer. The composition may further contain at least one reactive component and at least one photo-initiator. The composition is formulated so as to be compatible for use with ink-jet printers and to have a viscosity at room temperature above 50 cps.

The compositions will be described in further detail below.

Figure 1:
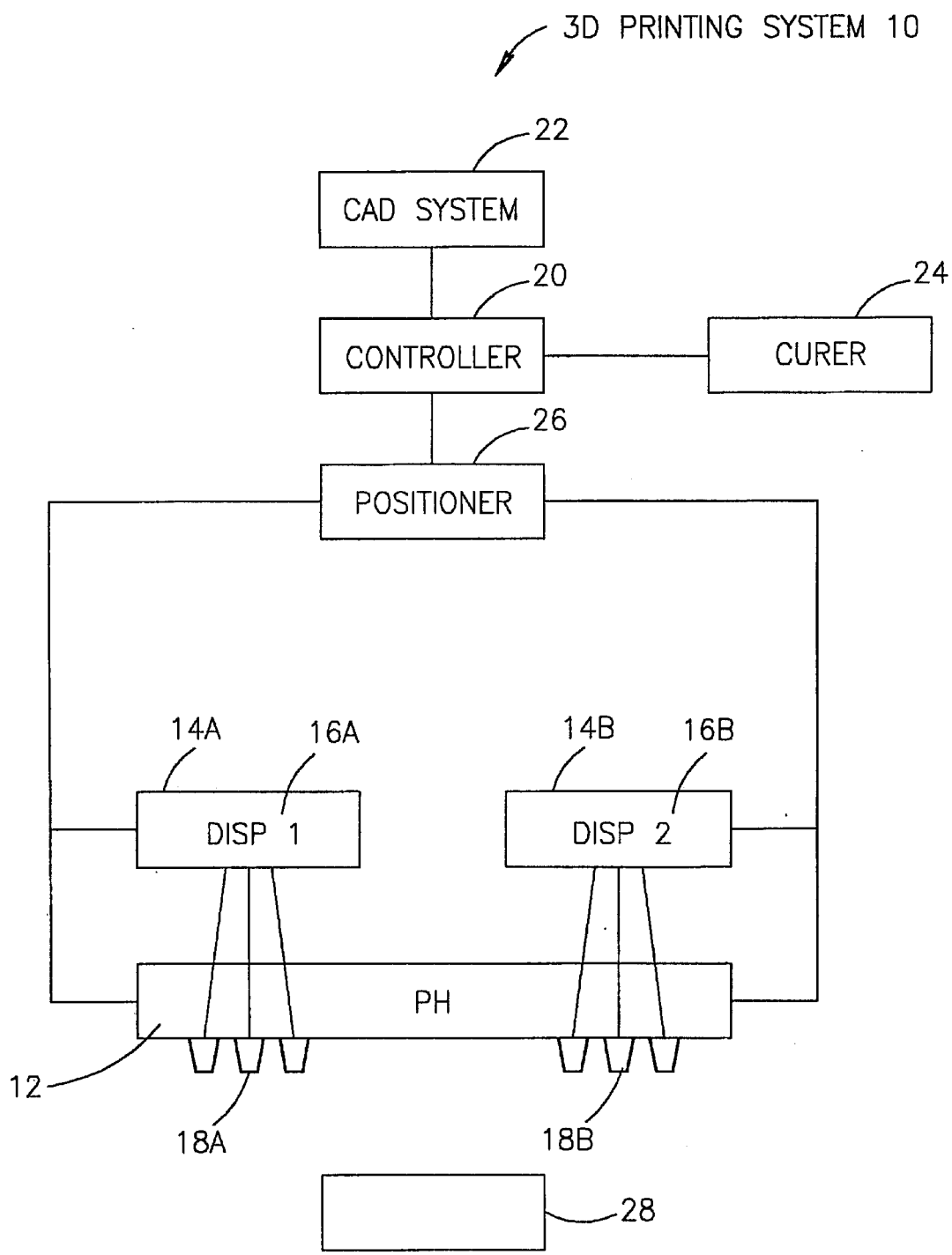
FIG. 1 is a schematic illustration of an embodiment of a 3-D printing system, described in U.S. patent application Ser. No. 09/412,618, assigned to the Assignees of the present application.

The 3-D object of the present invention can be built using a 3-D printing system similar to the one described in U.S. patent application Ser. No. 09/412,618, assigned to the Assignees of the present application and incorporated herein by reference. The 3-D printing system is shown in FIG. 1, to which reference is now made. FIG. 1 is an illustration of a 3-D printing system, generally designated 10, which includes one or more printing heads, referenced 12, and at least two dispensers generally referenced 14 and individually referenced 14a and 14b, containing interface materials, generally referenced 16 and individually referenced 16a and 16b, respectively.

Printing head 12 has a plurality of ink-jet type nozzles 18, through which interface materials 16a and 16b are jetted. In one embodiment, first dispenser 14a is connected to a first set of nozzles, referenced 18a, and second dispenser 14b is connected to a second set of nozzles, referenced 18b. Thus first interface material 16a is jetted through nozzles 18a, and second interface material 16b is jetted through nozzles 18b. Alternatively, in another embodiment (not shown), the 3-D printing system may comprise at least two printing heads. The first printing head is connected to first dispenser 14a and is used to jet first interface material 16a; and the second printing head is connected to second dispenser 14b and is used to jet second interface material 16b.

The 3-D printing system 10 further includes a controller 20, a Computer Aided Design (CAD) system 22, curing unit 24, and optionally a positioning apparatus 26. The controller 20 is coupled to the CAD system 22, curing unit 24, positioning apparatus 26, printing head 12 and each of the dispensers 14.

The 3-D object being produced (28) is built in layers, the depth of each layer being controllable by selectively adjusting the output from each of the ink-jet nozzles 18.

By combining or mixing materials from each of the dispensers, wherein each dispenser contains interface material having a different hardness, it is possible to adjust and control the hardness of the material forming the 3-D object being produced. Thus, by combining the interface material being output from each of the dispensers, different parts of the 3-D object having a different modulus of elasticity and a different strength can be produced.

As used hereinafter, the term "strength" is used as a relative term to indicate the difference in modulus of elasticity among interface materials. The strength of a material may be described by reference to its modulus of elasticity, which may be defined as: "the ratio of stress to its corresponding strain under given conditions of load, for materials that deform elastically, according to Hooke's law".

In accordance with one embodiment of the present invention, the first dispenser 14a contains a first interface material 16a, referred to hereinafter as the "first interface material", and the second dispenser 14b contains a second interface material 16b, referred to hereinafter as the "second interface material". The first interface material has a different (harder) modulus of elasticity and a greater strength than the second interface material. By combining the first interface material and the second interface material, different layers of the 3-D object having a different modulus of elasticity and a different strength can be produced, such as, for example, a construction layer, a support layer and a release layer, as defined hereinbelow.

For example, combining the first interface material and the second interface material forms a multiplicity of construction layers, which are defined as the layers constituting the 3-D object. Multiplicity, as used hereinafter, refers to a number which is one or greater.

Further, combining the first interface material and the second interface material forms a multiplicity of support layers, which are defined as the layers supporting the 3-D object, and not constituting the 3-D object.

Further, combining the first interface material and the second interface material forms a multiplicity of release layers, which are defined as the layers (not constituting the 3-D object) for separating the 3-D object layer from layers such as the support layers. The release layers have a lower modulus of elasticity and a lower strength than the construction layers and the support layers.

In one embodiment, the support layers are designed exactly as the construction layers, and thus have the same modulus of elasticity and the same strength as the construction layers. In this way, the construction layers form a core, and the support layers look like the negative printing of the core. The release layers are positioned between the construction layers and the support layers, and are used to separate the construction layers from the support layers.

In another embodiment, the support layers have a lower modulus of elasticity and a lower strength than the construction layers. The support layers may be separated from the construction layers by taking advantage of their weaker properties, as will be explained in detail below. Alternatively, the support layers may be separated from the construction layers by positioning release layers between the construction layers and the support layers.

Figure 2:
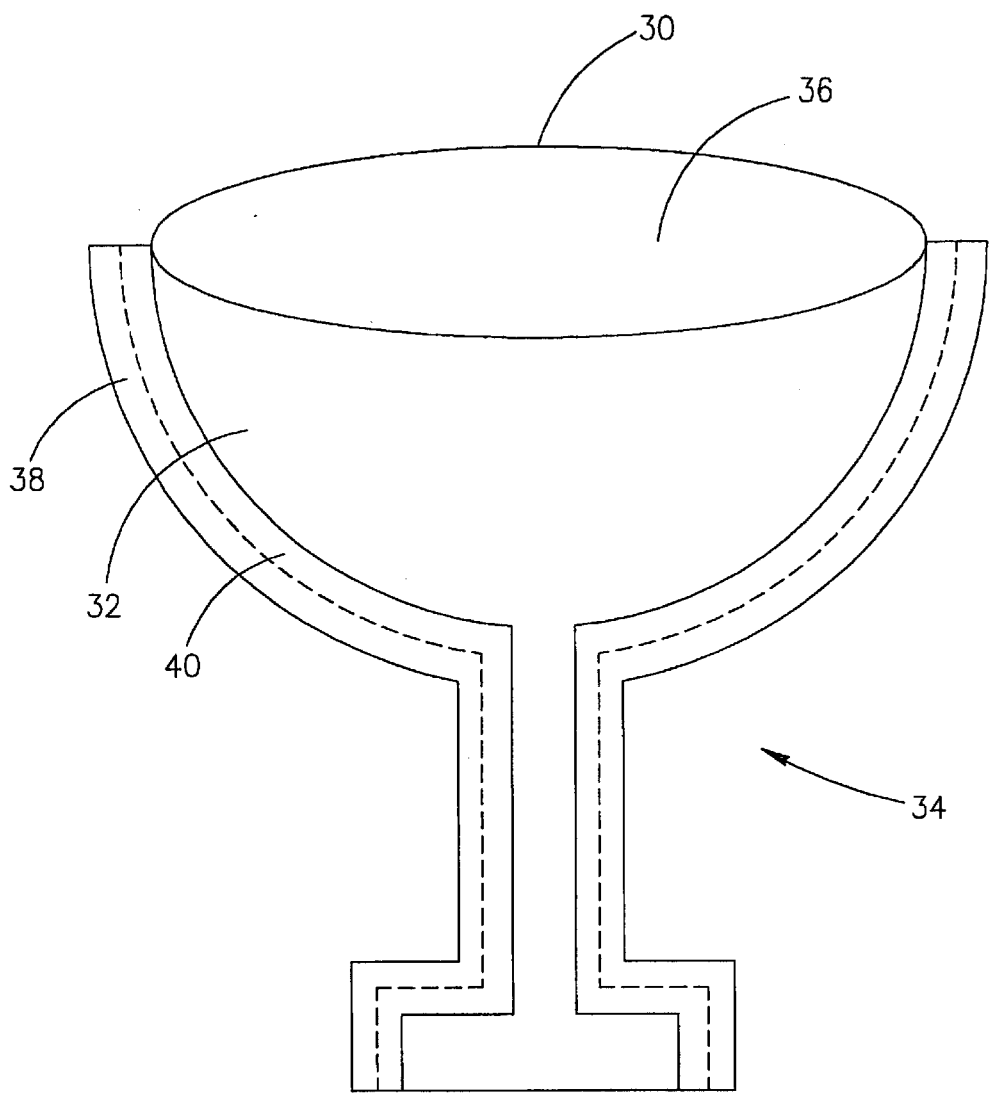
FIG. 2 is an elevational view of a 3-D object, constructed in accordance with an embodiment of the present invention.

In order to more clearly define the present invention, reference is now made to FIG. 2, which is a 3-D model of a wineglass, generally referenced 30. This 3-D model is printed using the ink-jet type printing system of FIG. 1. Combining the first interface material and the second interface material form a multiplicity of construction layers 32 which make up wine glass 30.

The construction layers 32 of wineglass 30 need to be supported externally, such as in the area referenced 34. Furthermore, an internal void, referenced 36, needs to be formed during printing. Thus a multiplicity of support layers 38, formed by combining the first interface material and the second interface material, are printed.

Furthermore, combination of the first interface material and the second interface material forms a multiplicity of release layers 40. In one embodiment, release layers 40 are positioned between construction layers 32 and support layers 38. Generally, release layers 40 have a different (lower) modulus of elasticity than support layers 38 and construction layers 32. Thus release layers 40 can be used to separate support layers 38 from construction layers 32.

The present invention, which will now be described in detail, provides compositions suitable for use as the first interface and as the second interface material.

The first interface material and second interface material of the present invention are especially designed and formulated for building a 3-D object using 3-D printing. Accordingly, the first and the second interface materials are designed to have increased viscosity at room temperature, which is defined as about 20–30 C. Preferably, the first and second interface material have a viscosity greater than 50 cps at room temperature, more preferably between 80 and 300 cps. In a preferred embodiment, the first and the second interface material have a viscosity of around 300 cps at room temperature.

Further, the first interface material and the second interface material have a second viscosity compatible with ink-jet printing, at a second temperature which is higher than room temperature. A composition compatible with ink-jet printing has low viscosity, preferably below 20 cps at the printing temperature, in order to function properly in the printing process. The first interface material and the second interface material, upon heating, have a viscosity preferably below 20 cps, enabling the construction of the 3-D object under heat. The temperature typically used to build the 3-D model of the present invention is higher than 60 C., preferably about 85 C. In one embodiment, the first and second interface materials have a viscosity of 8–15 cps at a temperature greater than 60 C. In another embodiment, the first and second interface materials have a viscosity of 11 cps at a temperature of about 85 C.

Having this viscosity, the first and second interface material are distinguished from prior art formulations designed for ink-jet printing, which have low viscosity at room temperature, the temperature at which the printing is conducted. High viscosity at room temperature is a desirable property for 3-D objects, a feature that is lacking in the prior art formulations.

First Interface Material

The first interface material is formulated to give, after curing, a solid material with mechanical properties that permit the building and handling of 3-D models. The first interface material of the present invention comprises:

- at least one reactive-component;
- at least one photo-initiator;
- at least one surface-active agent; and
- at least one stabilizer.

In one embodiment, the reactive component is an acrylic component, a molecule having one or more epoxy substituents, a molecule having one or more vinyl ether substituents, vinylpyrolidone, vinylcaprolactam, or any combination thereof. The acrylic component is an acrylic monomer, an acrylic oligomer, an acrylic crosslinker, or any combination thereof.

An acrylic monomer is a monofunctional acrylated molecule which can be, for example, esters of acrylic acid and methacrylic acid. An example of an acrylic monomer for the present invention is phenoxyethyl acrylate, marketed by Sartomer under the trade name SR-339. Another example of an acrylic monomer is marketed by Sartomer under trade name SR-9003.

An acrylic oligomer is a polyfunctional acrylated molecule which can be for example polyesters of acrylic acid and methacrylic acid and a polyhydric alcohol, such as polyacrylates and polymethacrylates of trimethylolpropane, pentaerythritol, ethylene glycol, propylene glycol and the like. Examples of acrylic oligomers are the classes of urethane acrylates and urethane methacrylates. Urethane-acrylates are manufactured from aliphatic or cycloaliphatic diisocyanates or polyisocyanates and hydroxyl-containing acrylic acid esters. An example is a urethane-acrylate oligomer marketed by Cognis under the trade name Photomer-6010.

An acrylic crosslinker is a molecule which provides enhanced crosslinking. Examples of such resins are 1,4-butanediol diacrylate, 1,4-butanediol dimethacrylate, 1,6-hexamethylene glycol diacrylate, neopentyl glycol dimethacrylate, trimethylol propane trimethacrylate, pentaerythritol triacrylate, penta-erythritol trimethacrylate triethylene glycol triacrylate, triethylene glycol trimethacrylate, and the like. An example of an acrylic crosslinker for the present invention is trimethylol propane triacrylate, marketed by Sartomer under the trade name SR-351. Another example of a crosslinker is UVM-45, marketed by CRODA.

The reactive component in the first interface material can also be a molecule having one or more vinyl ether substituents. Conventional vinyl ether monomers and oligomers which have at least vinyl ether group are suitable. Examples of vinyl ethers are ethyl vinyl ether, propyl vinyl ether, isobutyl vinyl ether, cyclohexyl vinyl ether, 2-ethylhexyl vinyl ether, butyl vinyl ether, ethyleneglocol monovinyl ether, diethyleneglycol divinyl ether, butane diol divinyl ether, hexane diol divinyl ether, cyclohexane dimethanol monovinyl ether and the like. An example of a vinyl ether for the present invention is 1,4 cyclohexane dimethanol divinyl ether, marketed by ISP under the trade name CHVE.

The reactive component in the first interface material can also be a molecule having one or more epoxy substituents. Conventional epoxy monomers and oligomers which have at least one oxirane moiety are preferred. Suitable epoxy containing molecules are displayed in Table 1 below:

TABLE 1

Examples of epoxy-containing reactive component

| Trade Name | Type of Material | Supplier |
|---|---|---|
| ERL-4299 or UVR-6128 | Bis-(3,4 cyclohexylmethyl) adipate | Union Carbide |
| UVR-6105 and UVR-6110 | 3,4-epoxy cyclohexylmethyl-3,4-epoxycyclohexyl carboxylate | Union Carbide |
| D.E.R 732 | Aliphatic epoxy, Polyglycol diglycidyl ether | Dow chemicals |
| Vinylcyclohexene Monoxide | 1,2 epoxy-4-vinylcyclohexane | Union Carbide |
| D.E.N. 431 | Epoxy novolac resin | Dow corning |
| UVR-6216 | 1,2-epoxy hexadecane | Union Carbide |

TABLE 1-continued

Examples of epoxy-containing reactive component

| Trade Name | Type of Material | Supplier |
|---|---|---|
| UVI-6100 | Cycloaliphatic epoxide diluent | Union Carbide |
| Vikoflex 7170 | Fullyl epoxidized soy bean oil | Elf Atochem, INC. |
| ERL-4221D | 3,4-epoxy cyclohexylmethyl 3,4-epoxy cyclohexane carboxylate | Union Carbide |

The reactive component of the first interface material can comprise any combination of an acrylic component as defined hereinabove, a molecule having one or more epoxy substituents as defined hereinabove, a molecule having one or more vinyl ether substituents as defined hereinabove, vinylcaprolactam and vinylpyrolidone.

In one embodiment, the reactive component of the first interface material comprises an acrylic monomer, an acrylic oligomer, an acrylic crosslinker and vinylcaprolactam. In another embodiment, the reactive component comprises an acrylic component as defined hereinabove and a molecule having one or more epoxy substituents as defined hereinabove. In another embodiment, the reactive component of the first interface material comprises an acrylic component as defined hereinabove and a molecule having one or more vinyl ether substituents as defined hereinabove. In another embodiment, the reactive component in the first interface material comprises a molecule having one or more vinyl ether substituents as defined hereinabove, and a molecule having one or more epoxy substituents as defined hereinabove.

The photo-initiator of the first interface material and of the second interface material may be the same or different, and is a free radical photo-initiator, a cationic photo-initiator, or any combination thereof.

The free radical photo-initiator can be any compound that produces a free radical on exposure to radiation such as ultraviolet or visible radiation and thereby initiates a polymerization reaction. Examples of some suitable photo-initiators include benzophenones (aromatic ketones) such as benzophenone, methyl benzophenone, Michler's ketone and xanthones; acylphosphine oxide type photo-initiators such as 2,4,6-trimethylbenzolydiphenyl phosphine oxide (TMPO), 2,4,6-trimethylbenzoylethoxyphenyl phosphine oxide (TEPO), and bisacylphosphine oxides (BAPO's); benzoins and bezoin alkyl ethers such as benzoin, benzoin methyl ether and benzoin isopropyl ether and the like. Examples of photo-initiators are alpha-amino ketone, marketed by Ciba Specialties Chemicals Inc. (Ciba) under the trade name Irgacure 907, and bisacylphosphine oxide (BAPO's), marketed by Ciba under the trade name I-819.

The free-radical photo-initiator can be used alone or in combination with a co-initiator. Co-initiators are used with initiators that need a second molecule to produce a radical that is active in the UV-systems. Benzophenone is an example of a photoinitiator that requires a second molecule, such as an amine, to produce a reactive radical. After absorbing radiation, benzophenone reacts with a ternary amine by hydrogen abstraction, to generate an alpha-amino radical which initiates polymerization of acrylates. An example of a class of co-initiators are alkanolamines such as triethylamine, methyldiethanolamine and triethanolamine.

Suitable cationic photo-initiators for the present invention include compounds which form aprotic acids or Bronstead acids upon exposure to ultraviolet and/or visible light sufficient to initiate polymerization. The photo-initiator used may be a single compound, a mixture of two or more active compounds, or a combination of two or more different compounds, i.e. co-initiators. Examples of suitable cationic photo-initiators are aryldiazonium salts, diaryliodonium salts, triarylsulphonium salts, triarylselenonium salts and the like. A preferred cationic photo-initiator for the present invention is a mixture of triarylsolfonium hexafluoroantimonate salts marketed by Union Carbide as UVI-6974.

Other components of the first interface material and the second interface material of the present invention are surface-active agents and inhibitors (thermal stabilizers). A surface-active agent is used to reduce the surface tension of the formulation to the value required for jetting, which is typically around 30 dyne/cm. An example of a surface-active agent for the present invention is silicone surface additive, marketed by Byk Chemie under the trade name Byk 307. Inhibitors are employed in the formulations of the first interface material and the second interface material to permit the use of the formulation at high temperature, preferably around 85 C., without causing thermal polymerization.

In one embodiment of the present invention, the first interface material further comprises at least one pigment and at least one dispersant. The pigment is a white pigment, an organic pigment, an inorganic pigment, a metal pigment or a combination thereof. An example of a white pigment for the present invention is organic treated titanium dioxide, marketed by Kemira Pigments under the trade name UV TITAN M160 VEG. An example of an organic pigment for the present invention is an organic pigment marketed by Elementis Specialities under the trade name Tint Aid PC 9703. Examples of dispersants for the present invention are dispersants comprising a copolymer with acidic groups marketed by Byk Chemie under the trade name Disperbyk 110, and a dispersant comprising a high molecular weight block copolymer with pigment affinic groups, marketed by Byk Chemie under the trade name Disperbyk 163.

Furthermore, in one embodiment of the present invention, combinations of white pigments and dyes are used to prepare colored resins. In such combinations, the white pigment has a double task: 1) to impart opacity; and 2) to shield the dye from UV radiation, to prevent bleaching of the resin. Thus, in accordance with one embodiment of the present invention, the first interface material further comprises a dye. The dye is chosen so as not to interfere with the curing efficiency of the formulation of the first interface material. The dye may be any of a broad class of solvent soluble dyes. Some examples are azo dyes which are yellow, orange, brown and red; anthraquinone and triarylmethane dyes which are green and blue; and azine dye which is black. An example of a dye for the present invention is Solvent Red 127, marketed by Spectra Colors Corp. under the trade name Spectrasol RED BLG.

The relative proportions of the different components of the first interface material can vary. In one embodiment, the first interface material comprises the following components: 50% acrylic oligomer(s), 30% acrylic monomer(s), 15% acrylic crosslinker, 2% photoinitiator, surface active agent, pigments, dispersants; and stabilizers.

Examples of preferred formulations of the first interface material are provided hereinbelow in Tables 2–4, to which reference is now made. Tables 2 and 3 illustrate examples of possible formulations of the first interface material. Table 4 illustrates examples of colored formulations, which comprise pigments, dispersants and dyes, as defined hereinabove. To any of the examples in Tables 2 and 3 may be added the combination of the colorants of Table 4.

TABLE 2

Examples of Characteristic Formulation Components of First Interface Material

| # | Trade Name | Chemical Type | Function in the formulation | Supplier |
|---|---|---|---|---|
| A | Photomer-6010 | Urethane Acrylate Oligomer | Oligomer | Cognis |
| B | SR-339 | Phenoxy ethyl Acrylate | monomer | Sartomer |
| C | SR-351 | Trimethylol propane triacrylate | Cross-linker | Sartomer |
| D | Irgacure 907 | alpha-Amino Ketone | Free radical photo-initiator | Ciba Specialties Chemical Inc. |
| E | BP | Benzophenone | Free radical photo-initiator | Satomer |
| F | Triethanol Amine | Ternary Amine | Free radical Coinitiator | Sigma |
| G | Byk 307 | Silicone Surface Additive | Surface agent | Byk Chemie |
| H | MEHQ | 4-Methoxy phenol | Inhibitor | Sigma |
| I | Cyracure UVR-6110 | 3,4 Epoxycyclohexyl-methyl-3,4-epoxycyclohexyl-carboxylate | Epoxy oligomer | Union Carbide |
| J | UVI-6974 | Mixed Triaryl-sulfonium Hexafluoro-antimonate Salts | Cationic photo-initiator | Union Carbide |
| K | CHVE | 1,4-cyclohexane dimethanol divinyl ether | Vinyl Ether Monomer | ISP |
| L | UV TITAN M160 VEG | Organic Treated Titanium Dioxide | White pigment | KEMIRA PIGMENTS |
| M | Disperbyk 110 | Copolymer with acidic groups | Pigment Dispersant | Byk Chemie |
| N | Spectrasol RED BLG | Solvent Red 127 | Dye | Spectra Colors Corp. |
| O | Tint Aid PC 9703 | Organic pigment | Organic pigment | Elementis Specialties |
| P | Disperbyk 163 | High molecular weight block copolymer with pigment affinic groups | Pigment Dispersant | Byk Chemie |
| Q | V-Cap | Vinylcaprolactam | Monomer | ISP |
| R | V-Pyrol | Vinylpyrolidone | Monomer | ISP |

TABLE 3

Examples of Possible Formulation Compositions of First Interface Material

| Example | A | B | C | D | E | F | G | H | I | J | K | Q | R |
|---|---|---|---|---|---|---|---|---|---|---|---|---|---|
| 1 | X | X | X | X |   |   | X | X |   |   |   |   |   |
| 2 | X | X |   | X |   |   | X | X |   |   |   |   |   |
| 3 | X |   | X | X |   |   | X | X |   |   |   |   |   |
| 4 |   | X | X | X |   |   | X | X |   |   |   |   |   |
| 5 | X | X | X |   | X | X | X | X |   |   |   |   |   |
| 6 | X | X |   |   | X | X | X | X |   |   |   |   |   |
| 7 | X |   | X |   | X | X | X | X |   |   |   |   |   |
| 8 |   | X | X |   | X | X | X | X |   |   |   |   |   |
| 9 | X |   | X | X |   |   | X | X |   |   | X |   |   |
| 10 | X |   |   | X | X | X | X | X |   |   | X |   |   |
| 11 |   |   |   |   |   |   | X | X | X | X | X |   |   |
| 12 |   | X | X | X |   |   | X | X | X | X |   |   |   |
| 13 | X | X | X | X | X | X | X | X | X | X | X |   |   |
| 14 | X | X | X | X |   |   | X | X |   |   |   | X |   |
| 15 | X | X | X | X |   |   | X | X |   |   |   |   | X |

TABLE 4

Examples of colored formulations of first interface material

| Example | L | M | N | O | P |
|---|---|---|---|---|---|
| 16 | X | X |   |   |   |
| 17 | X | X | X |   |   |
| 18 | X | X |   | X | X |
| 19 |   |   |   | X | X |
| 20 |   |   | X | X | X |

A particularly preferred formulation of the first interface material is presented in entry No. 14 of Table No. 3. According to this particularly preferred embodiment of the present invention, the first interface material comprises an acrylic oligomer, which can be any acrylic oligomer as defined hereinabove, and which is preferably a urethane acrylate oligomer;

an acrylic monomer, which can be any acrylic monomer as defined hereinabove, and which is preferably phenoxy ethyl acrylate;

an acrylic crosslinker, which can be any acrylic crosslinker as defined hereinabove, and which is preferably trimethylol propane triacrylate;

a radical photo-initiator, which can be any radical photo-initiator as defined hereinabove, and which is preferably alpha-amino ketone;

a surface agent, which is preferably a silicone surface additive;

an inhibitor, which is preferably 4-methoxyphenol; and vinylcaprolactam.

Second Interface Material

The second interface material is formulated to form a release layer to permit a manual easy cleaning of the 3-D model from its support. The second interface material may be one of two different principle kinds: 1) a liquid material lacking any curable groups that remains liquid even after curing. In one embodiment, the liquid is water miscible and is easily washed, out by water; and 2) a solid material that is formulated as a very weak curable material that, when cured, is capable of swelling in water or in alkaline or acidic water. Thus, when cured, the second interface material swells and almost breaks upon exposure to water, with minimum manual work required. In both cases the second interface material is formulated so as to permit fast, easy and efficient removal of the second interface material and cleaning of the 3-D model from its support.

The second interface material of the present invention comprises:

at least one non-reactive and low toxicity compound;

at least one surface-active agent; and at least one stabilizer.

The non-reactive component of the second interface material is a non-reactive and low toxicity compound, preferably a water miscible one. The non-reactive component is chosen to enhance the water-swelling rate, and to reduce the mechanical strength of the second interface material. High water diffusion rate is desirable in order to minimize the time needed for the water cleaning process of the 3-D model. Examples of non-reactive components for the present invention are polyethylene glycol marketed by Aldrich under the trade name PEG 400, methoxypolyethylene glycol marketed by Aldrich under the trade name methoxycarbowax 500 and 1000, and propylene glycol. Other examples are ethoxylated polyols and glycerol.

In one embodiment, the second interface material is formulated as a liquid. The liquid formulation is a non-curable composition that remains liquid even after radiation exposure. Thus, the liquid formulation comprises only non-reactive components and does not comprise reactive components that are capable upon solidifying upon curing. Preferably, the material is water miscible, and can be easily washed out with water.

However, the second interface material is not limited to a liquid formulation. In another embodiment of the present invention, the second interface material further comprises at least one reactive component and at least one photo-initiator. According to this embodiment, the second interface material is formulated as a curable composition that is capable of solidifying upon curing. The reactive components may be similar to those used in the first interface material, but are chosen specifically to give a hydrophillic cured resin, with very weak mechanical properties. Thus, upon curing, a solid composition is formed that is very weak and can be easily pulverized by hand or using water.

The reactive component is at least one of an acrylic component, a molecule having one or more vinyl ether substituents, or a water miscible component that is, after curing, capable of swelling upon exposure to water or to an alkaline or acidic water solution.

The acrylic component is an acrylic monomer or an acrylic oligomer, and may be any one of the examples defined hereinabove. Examples of acrylic components for use in the second interface material of the present invention are polyethylene glycol monoacrylate, marketed by Laporte under the trade name Bisomer PEA6, and polyethylene glycol diacrylate, marketed by Sartomer under the trade name SR-610, methoxypolyethylene glycol 550 monomethacrylate, and the like.

The reactive component of the second interface material can also be a water miscible component that is, after curing, capable of swelling upon exposure to water or to an alkaline or acidic water solution. Examples of water miscible components for the present invention are an acrylated urethane oligomer derivative of polyethylene glycol-polyethylene glycol urethane diacrylate, a partially acrylated polyol oligomer, an acrylated oligomer having hydrophillic substituents, or any combination thereof. The hydrophilic substituents are acidic substituents, amino substituents, hydroxy substituents, or any combination thereof. An example of an acrylated monomer with hydrophillic substituents is betha-carboxyethyl acrylate, which contains acidic substituents.

The reactive component of the second interface material can also be a molecule having one or more vinyl ether substituents, which may be any of the compounds as defined hereinabove. An example of vinyl ether for the second interface material is 1,4-cyclohexane dimethanol divinyl ether, marketed by ISP under the trade name CHVE.

In one embodiment, the reactive component of the second interface material is an acrylic oligomer. In another embodiment, the reactive component of the second interface material is a combination of an acrylic component as defined hereinabove and a water miscible component as defined hereinabove. In another embodiment, the reactive component of the present invention is a combination of an acrylic component as defined hereinabove and a molecule having one or more vinyl ether substituents, as defined hereinabove. In another embodiment, the reactive component of the present invention is a combination of a water miscible component as defined hereinabove, and a molecule having one or more vinyl ether substituents, as defined hereinabove.

When the second interface material comprises a reactive material, the second interface material further comprises a photo-initiator. The photo-initiator can be any photo-initiator, as defined above.

Besides swelling, another characteristic of the solid support upon exposure to water or to an alkaline or acidic water solution may be the ability to break down during exposure to water or to an alkaline or acidic water solution. Because the second interface material is made of hydrophillic components, during the swelling process, internal forces appear and cause fractures and breakdown of the cured second interface material.

In addition, the second interface material may be at least partially water-soluble. At least part of the second interface material is completely water soluble/miscible. During the removal of the support and/or release layers, the water soluble/miscible components are extracted out with water.

In addition, in one embodiment, the second interface material liberates bubbles upon exposure to water or to an alkaline water or acidic water solution. The bubbles are intended to help in the process of removal of the support and/or release layers from the construction layers.

In one embodiment, the bubbles may be liberated by a bubble releasing substance (BRS) that is present in the water solution that is used to clean out the 3-D object. Such a substance may be a carbonate or bicarbonate, for example sodium bicarbonate (SBC). During the swelling process, at least part of the SBC is introduced or absorbed into the second interface material, where it is transformed into carbon dioxide gas ($CO_2$) and a water-soluble salt. The trigger for the production of $CO_2$ may be the reaction of the SBC with an acid functionality present in the second interface material. Such acid functionality may be introduced as part of the second interface material formulation or introduced later, after curing, using an acid water solution. For example, the first step may be to put the 3-D object with its support in a water solution containing a SBC, then to place the same object in an acidic solution. The acid will start to decompose the SBC and product gas (bubbles).

In another embodiment, the substance that liberates gas is already present in the formulation of the second interface material. For example, the second interface material may contain calcium carbonate as a solid pigment. In that case, the trigger is the introduction of the second interface material in a water or acidic solution.

It should be clear that a BRS is not limited to a sodium bicarbonate or calcium carbonate and an acidic water solution. Other chemical reagents and reactions may be used to achieve the same result—the production of bubbles inside the matrix of the second interface material. For example, the SBC may be any alkaline metal or alkaline earth metal carbonate or bicarbonate.

Examples of preferred formulations of the second interface material are provided hereinbelow in Table 5 and Table 6, to which reference is now made. Tables 5 and 6 display various formulations that are suitable for use as the second interface material.

TABLE 5

Examples of Characteristic Formulation Components of Second Interface Material

| # | Trade Name | Chemical Type | Function in the formulation | Supplier |
|---|---|---|---|---|
| A | SR-610 | Polyethylene glycol (600) Diacrylate | Oligomer | Sartomer |
| B | Bisomer PEA6 | Polyethylene glycol monoacrylate | Water swelling/ sensitive Oligomer | Laport |
| C | PEG 400 | Polyethylene glycol 400 | Polymer (hydrophilic and palsticizer) | Aldrich |
| D | Irgacure 907 | alpha-Amino Ketone | Free radical photo-initiator Type I | Ciba Specialties Chemical Inc. |
| E | BP | Benzophenone | Free radical photo-initiator Type II | Satomer |
| F | Triethanol Amine | Ternary Amine | Free radical Coinitiator for Type II photo-initiator | Aldrich |
| G | Byk 307 | Silicone Surface Additive | Surface agent | Byk Chemie |
| H | MEHQ | 4-Methoxy phenol | Inhibitor (thermal stabilizer) | Sigma |
| I | PEG UA | Polyethylene glycol urethane diacrylate | Water swelling/sensitive oligomer | Home made |
| J | AP | Partially acrylated polyol | Water swelling/ sensitive oligomer | Home made |
| K | Betha-CEA | Betha-caboxyethyl acrylate | Acidic monomer | |
| M | CHVE | 1,4-Cyclohexane dimethanol divinyl ether | Vinyl ether monomer | ISP |
| N | Tone polyol 0301 | Caprolactone polyol | Polyol (plasticizer) | Union Cabide |
| P | methoxycarbo wax 500 and 1000 | methoxypolyethylene glycol | Polymer (hydrophilic and palsticizer) | |

TABLE 6

Examples of Possible Formulation Compositions of Second Interface Material

| Example | A | B | C | D | E | F | G | H | I | J | K | L | M | N |
|---|---|---|---|---|---|---|---|---|---|---|---|---|---|---|
| 1  | X |   | X | X |   |   | X | X |   |   |   |   |   |   |
| 2  | X |   | X |   | X | X | X | X |   |   |   |   |   |   |
| 3  |   | X | X | X |   |   | X | X |   |   |   |   |   |   |
| 4  |   | X | X |   | X | X | X | X |   |   |   |   |   |   |
| 5  | X | X | X | X |   |   | X | X |   |   |   |   |   |   |
| 6  | X | X | X |   | X | X | X | X |   |   |   |   |   |   |
| 7  |   |   | X |   |   |   | X | X | X |   |   |   |   |   |
| 8  |   |   | X | X |   |   | X | X |   | X |   |   |   |   |
| 9  |   | X | X | X |   |   | X | X |   |   | X |   |   |   |
| 10 |   |   | X | X |   |   | X | X |   |   |   | X |   |   |
| 11 |   |   | X | X |   |   | X | X |   |   |   |   |   |   |
| 12 | X |   |   | X |   |   | X | X |   |   |   |   | X | X |
| 13 |   | X |   | X |   |   | X | X |   |   | X |   |   | X |
| 14 |   | X | X | X | X | X | X |   |   |   | X | X |   | X |

A particularly preferred formulation of the second interface material is presented in entry No. 3 of Table 6. According to this particularly preferred embodiment of the present invention, the second interface material comprises:

a water swelling oligomer, which can be any water swelling oligomer as defined hereinabove, and which is preferably polyethylene glycol monoacrylate;

a non-reactive component, which can be any non-reactive component as defined hereinabove, and which is preferably polyethylene glycol;

a radical photo-initiator, which can be any radical photo-initiator as defined hereinabove, and which is preferably alpha-amino ketone;

a surface agent, which is preferably a silicone surface additive; and an inhibitor, which is preferably 4-methoxyphenol.

Another particularly preferred formulation of the second interface material is presented in entry No. 4 of Table 6. According to this particularly preferred embodiment of the present invention, the second interface material comprises:

a water swelling oligomer, which can be any water swelling oligomer as defined hereinabove, and which is preferably polyethylene glycol monoacrylate;

a non-reactive component, which can be any non-reactive component as defined hereinabove, and which is preferably polyethylene glycol;

a radical photo-initiator, which can be any radical photo-initiator as defined hereinabove, and which is preferably benzophenone;

a co-initiator, which can be any co-initiator as defined hereinabove, and which is preferably triethanolamine;

a surface agent, which is preferably a silicone surface additive; and an inhibitor, which is preferably 4-methoxyphenol.

The first interface material and the second interface material are suitable for use in the method for 3-D printing which is described in U.S. patent application Ser. No. 09/412,618, assigned to the Assignees of the present application and is incorporated herein by reference.

Briefly, the method comprises:

dispensing a first interface material from a printing head;

dispensing a second interface material from said printing head; and combining the first interface material and the second interface material in pre-determined proportions to a produce a multiplicity of construction layers for forming the three-dimensional model.

In accordance with one embodiment of the present invention, the method further comprises the step of curing the first interface material. Further, when the second interface material comprises a reactive component, the method may further comprise the step of curing the second interface material. Curing may be carried out as described in U.S. patent application Ser. No. 09/412,618. For example, the curing method is by radiation, such as Ultraviolet (UV) and/or Visible (Vis) and/or Infra Red (IR) and/or UV-Vis radiation. Preferably the curing method is UV-Vis radiation.

In operation, in order to obtain layers of different modulus of elasticity and a different strength, the first interface material and the second interface material are combined in pre-determined proportions. For example, in order to obtain layers having a higher modulus of elasticity and a higher strength such as the construction layers, a suitable combination that contains mostly the first interface material is used. Further, in order to obtain layers having a lower modulus of elasticity and a lower strength such as the release layers, a suitable combination that includes mostly the second interface material is used.

By way of example, in order to produce the construction layers and/or the support layers, a combination that includes 90–100% of the first interface material and 0–10% of the second interface material is used. Further, in order to produce the release layers, a combination that includes 0–10% of the first interface material and 90–100% of the second interface material is used. In another embodiment, in order to produce support layers that have a lower modulus of elasticity and a lower strength than the construction layers, a combination that includes 30–70% of the first interface material and 70–30% of the second interface material is used.

Thus a 3-D object is produced which is comprised of a core consisting of a multiplicity of construction layers. The construction layers are formed by combining predetermined proportions of the first interface material and the second interface material.

In one embodiment of the present invention, the 3-D object further comprises a multiplicity of support layers for supporting the core. The support layers are prepared by combining pre-determined proportions of the first interface material and the second interface material. The support layers may be designed exactly like to construction layers, or may be designed to be weaker (lower modulus of elasticity) than the construction layers.

In one embodiment of the present invention, the 3-D object further comprises a multiplicity of release layers for releasing the support layers from the construction layers. Preferably, the release layers are positioned between the support layers and the construction layers. The release layers are prepared by combining pre-determined proportions of the first interface material and the second interface material.

It will be appreciated by persons skilled in the art that the present invention is not limited by what has been particularly shown and described herein above and that numerous modifications, all of which fall within the scope of the present invention, exist. Rather, the scope of the invention is defined by the claims which follow:

What is claimed is:

1. A method for the preparation of a three-dimensional object by three-dimensional printing, said method comprising the steps of:
    dispensing a first interface material from a dispenser, said first interface material comprising:
        at least one reactive component;
        at least one photo-initiator;
        at least one surface-active agent; and
        at least one stabilizer;
    dispensing a second interface material from said dispenser, said second interface material comprising:
        at least one non-reactive and low toxicity compound;
        at least one surface-active agent; and
        at least one stabilizer; and
    combining said first interface material and said second interface material in pre-determined proportions to produce a multiplicity of construction layers for forming said three-dimensional object;
    whereby said first interface material is cured resulting in a solid form, and whereby said second interface material is irradiated or cured resulting in a liquid or a solid form capable of swelling or breaking down upon exposure to water or to an alkaline or acidic water solution.

2. The method according to claim 1, wherein said reactive component of said first interface material is an acrylic component, a molecule having one or more epoxy substituents, a molecule having one or more vinyl ether substituents, vinylpyrolidone, vinylcaprolactam, or any combination thereof.

3. The method according to claim 1, wherein said reactive component of said first interface material is comprised of at least one acrylic component.

4. The method according to claim 3, wherein said acrylic component is an acrylic monomer, an acrylic oligomer, an acrylic crosslinker, or any combination thereof.

5. The method according to claim 3, wherein said reactive component of said first interface material further comprises a molecule having one or more epoxy substituents, a molecule having one or more vinyl ether substituents, vinylcaprolactam, vinylpyrolidone, or any combination thereof.

6. The method according to claim 3, wherein said reactive component of said first interface material further comprises vinylcaprolactam.

7. The method according to claim 1, wherein said reactive component of said first interface material is a molecule having one or more vinyl ether substituents.

8. The method according to claim 7, wherein said reactive component of said first interface material further comprises a molecule having one or more epoxy substituents.

9. The method according to claim 1, wherein said reactive component of said first interface material is a molecule having one or more epoxy substituents.

10. The method according to claim 1, wherein said photo-initiator of said first interface material is a free radical photo-initiator, a cationic photo-initiator or any combination thereof.

11. The method according to claim 1, wherein said first interface material further comprises at least one pigment and at least one dispersant.

12. The method according to claim 11, wherein said pigment is a white pigment, an organic pigment, an inorganic pigment, a metal pigment or a combination thereof.

13. The method according to claim 11, wherein said first interface material further comprises a dye.

14. The method according to claim 1, wherein said second interface material further comprises at least one reactive component and at least one photo-initiator.

15. The method according to claim 14, wherein said reactive component of said second interface material is at least one of an acrylic component, a molecule having one or more vinyl ether substituents, or a water miscible component that is, after curing, capable of swelling or breaking down upon exposure to water or to an alkaline or acidic water solution.

16. The method according to claim 14, wherein said reactive component of said second interface material is an acrylic component.

17. The method according to claim 16, wherein said acrylic component is an acrylic monomer, an acrylic oligomer or a combination thereof.

18. The method according to claim 14, wherein said reactive component of said second interface material comprises at least one water miscible component that is, after curing, capable of swelling or breaking down upon exposure to water or to an alkaline or acidic water solution.

19. The method according to claim 18, wherein the water miscible component is an acrylated urethane oligomer derivative of polyethylene glycol, a partially acrylated polyol oligomer, an acrylated oligomer having hydrophillic substituents, or any combination thereof.

20. The method according to claim 19, wherein the hydrophilic substituents are acidic substituents, amino substituents, hydroxy substituents, or any combination thereof.

21. The method according to claim 14, wherein said reactive component of said second interface material comprises a molecule having one or more vinyl ether substituents.

22. The method according to claim 1, wherein said non-reactive component of said second interface material is polyethylene glycol, methoxypolyethylene glycol, glycerol, ethoxylated polyol, or propylene glycol.

23. The method according to claim 1, wherein said first interface material and said second interface material have different modulus of elasticity and a different strength.

24. The method according to claim 23, wherein said first interface material has a higher modulus of elasticity and a higher strength than said second interface material.

25. The method according to claim 1, further comprising the step of forming a multiplicity of support layers for supporting said object.

26. The method according to claim 25, wherein said support layers are formed by combining the first interface material and the second interface material in pre-determined proportions.

27. The method according to claim 25, wherein said support layers have the same modulus of elasticity and the same strength as said constructions layers.

28. The method according to claim 25, wherein said support layers have a lower a lower modulus of elasticity and a lower strength than said construction layers.

29. The method according to claim 25, further comprising the step of combining said first interface material and said second interface material in pre-determined proportions to form a multiplicity of release layers for releasing said support layers from said object, said release layers having a lower modulus of elasticity and a lower strength than said construction layers and said support layers.

30. The method according to claim 1, wherein said first interface material and said second interface material each have a first viscosity at room temperature, and a second viscosity compatible with ink-jet printers at a second temperature, which may be the same or different, wherein said second temperature is higher than room temperature.

31. The method according to claim 1, further comprising the step of curing said first interface material.

32. The method according to claim 14, further comprising the step of curing said second interface material.

33. The method according to claim 1, further comprising the step of generating data for a pre-determined combination of said first interface material and said second interface material to produce a multiplicity of construction layers forming said three-dimensional object.

34. The method according to claim 1, further comprising the step of generating data for a pre-determined combination of said first interface material and said second interface material to produce a multiplicity of support layers for supporting said three-dimensional object.

35. The method according to claim 34, further comprising the step of generating data for a pre-determined combination of said first interface material and said second interface material to produce a multiplicity of release layers for releasing said three-dimensional object from said support layers.

36. The method according to claim 1, wherein said dispenser is an ink-jet head.

37. The method according to claim 1, wherein said first interface material and said second interface material are dispensed simultaneously.

38. The method according to claim 1, wherein said first interface material and said second interface material are dispensed sequentially.

39. The method according to claim 38, wherein said first interface material is dispensed first.

40. The method according to claim 38, wherein said second interface material is dispensed first.

41. The method according to claim 1, wherein more than one first interface material is used.

42. The method according to claim 1, wherein more than one second interface material is used.

43. A 3-D object comprised of a core consisting of a multiplicity of construction layers, wherein said construction layers are prepared by combining pre-determined proportions of a first interface material and a second interface material according to claim 1.

44. The object according to claim 43, further comprising a multiplicity of support layers for supporting said core, wherein said support layers are prepared by combining pre-determined proportions of said first interface material and said second interface material.

45. The object according to claim 44, wherein said support layers have the same modulus of elasticity and the same strength as said construction layers.

46. The object according to claim 44, wherein said support layers have a lower modulus of elasticity and a lower strength than said construction layers.

47. The object according to claim 44, further comprising a multiplicity of release layers for releasing said support layers from said core, wherein said release layers are positioned between said support layers and said construction layers; wherein said release layers are prepared by combining pre-determined proportions of said first interface material and said second interface material.

48. The object according to claim 47, wherein said release layers have a lower modulus of elasticity and a lower strength than said construction layers and said support layers.

49. A second interface composition suitable for use as a support for three-dimensional objects built by a method of selective dispensing, said composition comprising:

at least one non-reactive and low toxicity component;

at least one reactive component;

wherein said non-reactive and low toxicity component is not reactive with said reactive component, at least one surface-active agent;

at least one stabilizer; and at least one component able to produce gas upon exposure to water or to an alkaline or acidic water solution;

wherein said composition has a first viscosity of above 50 cps at room temperature, and a second viscosity compatible with ink-jet printers at a second temperature, wherein said second temperature is higher than room temperature;

wherein, after curing, said composition results in a solid form capable of swelling or breaking down upon exposure to water or to an alkaline or acidic water solution.

50. The composition according to claim 49, wherein said component able to produce gas is sodium bicarbonate.

51. The composition according to claim 49, further comprising water.

* * * * *

UNITED STATES PATENT AND TRADEMARK OFFICE
Certificate

Patent No. 6,569,373 B2                              Patented: May 27, 2003

On petition requesting issuance of a certificate for correction of inventorship pursuant to 35 U.S.C. 256, it has been found that the above identified patent, through error and without any deceptive intent, improperly sets forth the inventorship.
  Accordingly, it is hereby certified that the correct inventorship of this patent is: Eduardo Napadensky, Netanya, Israel; Hanan Gothait, Rehovot, Israel; and Israel Baharav, Ramat Hasharon, Israel.

Signed and Sealed this Fourth Day of January 2005.

JAMES J. SEIDLECK
*Supervisory Patent Examiner*
Art Unit 1711